United States Patent
Shako et al.

(10) Patent No.: US 7,962,107 B2
(45) Date of Patent: Jun. 14, 2011

(54) TRANSMISSION DEVICE

(75) Inventors: Hideharu Shako, Kawasaki (JP);
Takeshi Ohba, Kawasaki (JP);
Tomoyoshi Nohira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 597 days.

(21) Appl. No.: 12/130,639

(22) Filed: May 30, 2008

(65) Prior Publication Data

US 2008/0299920 A1 Dec. 4, 2008

(30) Foreign Application Priority Data

Jun. 1, 2007 (JP) ................................. 2007-147205

(51) Int. Cl.
*H04B 1/04* (2006.01)
*H01Q 11/12* (2006.01)

(52) U.S. Cl. .... 455/91; 455/114.3; 455/126; 455/127.1; 375/297

(58) Field of Classification Search .... 455/114.2–115.1, 455/126, 127.1–127.2, 127.5; 375/296–297
See application file for complete search history.

(56) References Cited

U.S. PATENT DOCUMENTS

| | | | | |
|---|---|---|---|---|
| 6,466,092 B2 * | 10/2002 | Kusunoki | ...................... | 330/149 |
| 6,525,605 B2 * | 2/2003 | Hu et al. | ....................... | 330/132 |
| 6,741,127 B2 * | 5/2004 | Sasho et al. | ................... | 330/136 |
| 7,558,542 B2 * | 7/2009 | Nandipaku et al. | ......... | 455/127.2 |
| 7,602,155 B2 * | 10/2009 | Markowski | ................... | 323/222 |
| 7,761,065 B2 * | 7/2010 | Drogi et al. | ................... | 455/126 |
| 7,787,564 B1 * | 8/2010 | Anvari | .......................... | 375/297 |
| 7,881,401 B2 * | 2/2011 | Kraut et al. | ................... | 375/296 |
| 2006/0012427 A1 * | 1/2006 | Nezami | ......................... | 330/149 |
| 2009/0163156 A1 * | 6/2009 | Rofougaran et al. | ....... | 455/127.1 |

FOREIGN PATENT DOCUMENTS

JP 09-312578 12/1997
* cited by examiner

*Primary Examiner* — Simon D Nguyen
(74) *Attorney, Agent, or Firm* — Murphy & King, PC

(57) ABSTRACT

In a transmission device including an RF power amplifier with less number of terminals for monitoring an input/output signal of the RF power amplifier, there are provided with an input signal detector detecting the input signal; an output signal detector detecting the output signal; a first power amplifier switch switching ON or OFF the power amplifier; a monitor terminal; and an RF switch selecting an input signal or output signal of the power amplifier to be transmitted to the monitor terminal, in association with the first power amplifier switch being switched ON or OFF.

8 Claims, 11 Drawing Sheets

TRANSMISSION DEVICE

CROSS-REFERENCE TO RELATED APPLICATIONS

This application is related to and claims priority to Japanese Patent Application No. 2007-147205, filed on Jun. 1, 2007, in the Japan Patent Office, and incorporated by reference.

BACKGROUND OF THE INVENTION

1. Field of the Invention

The present invention relates to a transmission device, and in particular to a transmission device, provided with a radio frequency or high frequency (hereinafter, represented by RF) power amplifier, applied to a radio base station.

2. Description of the Related Art

An RF power amplifier (hereinafter, abbreviated as amp) in a transmission device applied to a radio base station has the following functions:

Function capable of switching ON or OFF a source of the power amp;

Function capable of monitoring an input level of the power amp;

Function capable of monitoring an output level of the power amp.

Figure 10:
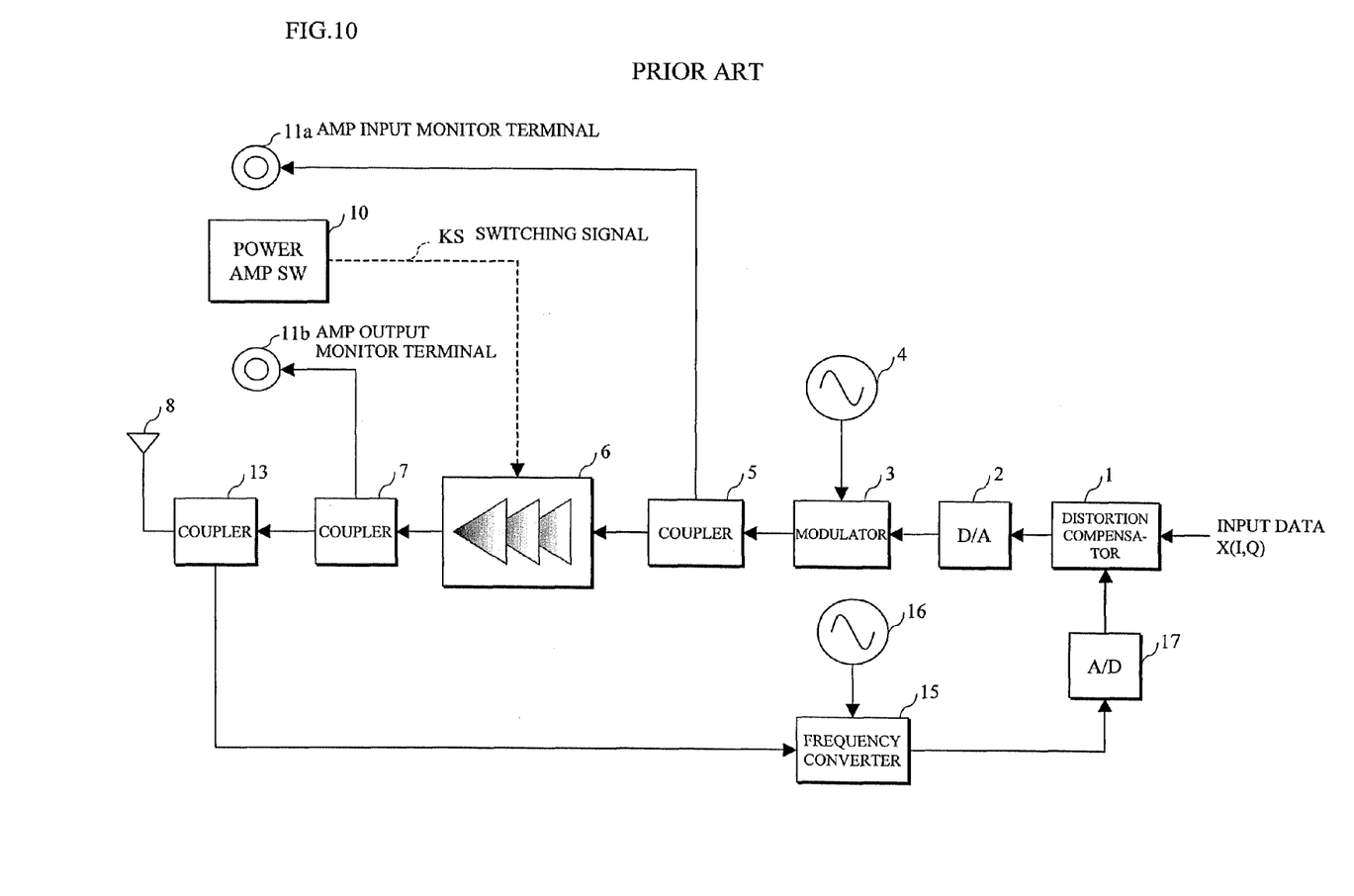
FIG. 10 is a block diagram showing a prior art example.

A prior art arrangement of such a transmission device is shown in FIG. 10. In this transmission device, when having received data X (I, Q) of a base band as an input, a distortion compensator 1 multiplies to the input data a distortion compensating coefficient of an RF power amp 6. An output signal of the distortion compensator 1 applied with the distortion compensating coefficient is converted by a D/A converter 2 into an analog IQ signal to be provided to a modulator 3. This modulator 3 performs a direct modulation with a local oscillator 4 of a carrier frequency (for example, 2.1 GHz bandwidth) to generate an RF signal.

The RF signal thus generated passes through a coupler 5 that forms an input signal detector of an RF power amp 6 and inputted to the amp 6. A signal power-amplified by the RF power amp 6 passes through a coupler 7 that forms an output signal detector of the RF power amp 6 together with a coupler 13 and transmitted to an antenna 8. It is to be noted that the couplers 5 and 7 respectively branch their input signals to an amp input monitor terminal 11a and an amp output monitor terminal 11b, and that a source of the RF power amp 6 is switched ON or OFF by a power amp switch 10.

For updating the distortion compensating coefficient of the distortion compensator 1, the coupler 13 provides a branched signal from its input signal to a frequency converter 15, which downconverts its input signal into an intermediate frequency (IF) signal with a local oscillator 16. The output signal of the frequency converter 15 is converted into a digital signal by an A/D converter 17 and provided to the distortion compensator 1, forming a feedback route. The distortion compensator 1 compares the input data X (I, Q) with the feedback data from the A/D converter 17 to update the distortion compensating coefficient, thereby suppressing distortion components of the RF power amp 6.

When a switching signal KS from the power amp switch 10 is made OFF or reset, the source within the RF power amp 6 is powered down so that its transmission output is suspended. For example, when experiments are desired to be performed while suspending the transmission output of the power amp 6, the power amp switch 10 is made OFF, whereby in the absence of a transmission wave from the antenna 8, such an event that the RF power amp 6 is faulted due to a reflecting wave does not occur even though the output of the antenna 8 is not terminated.

The amp input monitor terminal 11a outputs the input signal of the RF power amp 6 which is branched at the coupler 5, which is used in such a case where the transmission wave is required to be confirmed at the above experiments. Even at the suppression of the RF power amp 6, a signal comes in up to the input terminal of the RF power amp 6, so that the transmission wave can be recognized by monitoring the signal.

The amp output monitor terminal 11b provides the output signal of the RF power amp 6 coupled by e.g. several 10 dB at the coupler 7. This enables the transmission output waveform to be recognized at the output terminal of the RF power amp 6 even upon the antenna 8 being connected, and also the transmission output level to be recognized if a coupling quantity of the coupler 7 is prescribed. It is of course that the transmission waveform can not be observed when the power amp switch 10 is made OFF.

As a reference document, there has been proposed a plural-mode shared transmitting circuit comprising local oscillation circuits, quadrature modulating circuits, gain variable circuits, power amp circuits and output monitor circuits respectively provided for each mode, in which a switch which selects monitor signals outputted from the output monitor circuits of the respective modes and inputs them into an output wave detecting circuit is as to enable sharing the output wave detecting circuit and a difference detecting circuit by the plural modes and the switch which selects differential voltage outputted from the difference detecting circuit and inputs them into gain variable circuits are provided; thus, an automatic power control circuit is shared so that the circuit scale and volume are reduced and the cost is also reduced (See e.g. Patent document 1).

[Patent document 1] Japanese Patent Application Laid-open No. 9-312578

(1) Problem on Mounting

While downsizing the radio base station is a big issue for recent customers' demands, the above prior art is disadvantageous in that it has two monitor terminals, i.e. an amp input monitor terminal and an amp output monitor terminal, causing the surface area of the device to be enlarged.

(2) Problem on Operability

The above prior art uses the amp input monitor terminal at the time when the source of the power amp is turned or switched OFF, while using the amp output monitor terminal at the time when the source of the power amp is switched ON. Therefore, each time the power amp is switched ON or OFF, the connections of the monitor terminals have to be changed, resulting in a poor operability.

(3) Problem on Distortion Compensation

Figures 11A, 11B:
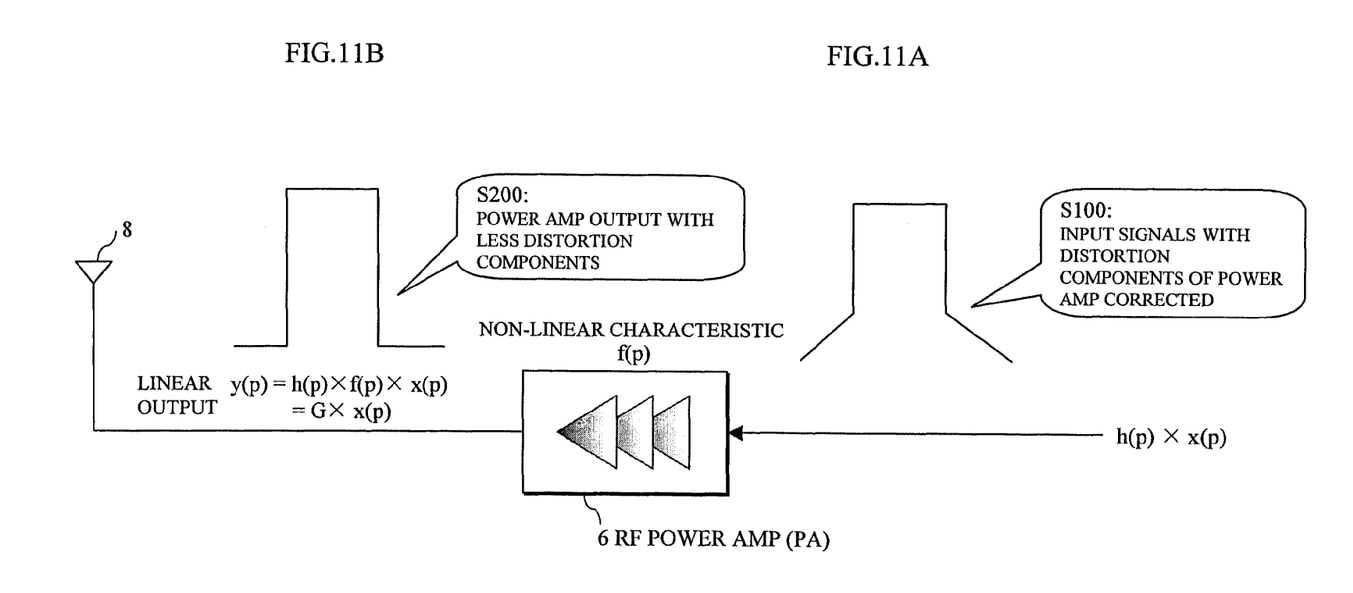
FIG. 11 is a block diagram for illustrating a predistortion type distortion compensating operation.

As shown in FIG. 11, a predistortion type distortion compensation is a technology for decreasing distortions at the output terminal of the power amp by predicting a distortion quantity f(p) based on a non-linear characteristic of the power amp and applying a signal preliminarily multiplied with a reverse distortion characteristic h(p) of the power amp to the input signal x(p) (step S100) (step S200). Resultantly, at the amp input monitor terminal, a signal h(p)*x(p) applied with the reverse distortion characteristic h(p) of the power amp is to be observed.

SUMMARY

It is accordingly one aspect of the present invention to provide a transmission device comprising an RF power amp, in which the number of terminals for monitoring the input/output of the power amp is reduced.

It is also an aspect of the present invention to provide a transmission device comprising an RF power amp, in which distortion components of an input monitor wave of the power amp when the power amp is switched OFF are decreased.

[1] In order to achieve the above-mentioned object, a transmission device according to one aspect of the present invention comprises: an RF power amp; an input signal detector detecting an input signal of the power amp; an output signal detector detecting an output signal of the power amp; a first power amp switch switching ON or OFF the power amp; a monitor terminal; and an RF switch selecting an input signal or output signal of the power amp to be transmitted to the monitor terminal, in association with the first power amp switch being switched ON or OFF.

Namely, according to an aspect of the present invention, for the solution of (1) problem on mounting and (2) problem on operability as aforementioned, the amp input monitor terminal and the amp output monitor terminal are unified as a single terminal to selectively monitor the amp input waveform or the amp output waveform in association with the power amp switch being made ON or OFF.

Therefore, with the ON/OFF signal of the power amp switch being made a control signal of the RF switch, the output signal of the power amp is selected when the power amp switch is, for example, made ON, while the input signal of the power amp is selected when the power amp switch is made OFF, to be provided as an output from the monitor terminal.

This enables the number of the monitor terminal to be confined to one and at the same time the monitor terminal is not required to be changed depending on ON/OFF state of the power amp, so that downsizing the RF base station and improving operability can be realized.

It is to be noted that in a front stage of the above input signal detector, a series circuit comprising a distortion compensator, a D/A converter, and a modulator may be connected, and that a coupler may be used for the above detectors.

[2] The transmission device according to an aspect of the present invention may further comprise, in addition to the arrangement of the above [1], a distortion compensator provided in a front stage of the input signal detector, a feedback route connected to the distortion compensator, and a second RF switch selecting an input signal or output signal of the power amp to be transmitted to the distortion compensator through the feedback route, in association with the power amp switch being switched ON or OFF.

Namely, with regard to (3) problem on distortion compensation as aforementioned, when the power amp is in OFF state, a feedback signal necessary for the distortion compensation is applied to the input side of the power amp in a feedback distortion compensating mode, whereby distortion components of input waves of the power amp to be monitored at the monitor terminal can be suppressed. When the power amp is in ON state, the output signal of the power amp obtained by performing the distortion compensation is monitored at the monitor terminal.

It is to be noted that in a front stage of the above input signal detector, the distortion compensator, the D/A converter, and the modulator may be serially connected, in which each of the above detectors may be composed of two couplers one of which branches its input signal to each RF switch.

[3] The transmission device according to an aspect of the present invention may further comprise, in addition to the arrangement of the above [1], a distortion compensator provided in a front stage of the power amp, a feedback route feeding back the output signal of the power amp to the distortion compensator, and a selector validating or invalidating the distortion compensator, in association with the power amp switch being switched ON or OFF.

Also in this case, with regard to (3) problem on distortion compensation as aforementioned, when the power amp is in OFF state where distortion components up to the input terminal of the power amp are originally quite small, a transmission signal with less distortion components can be monitored at the monitor terminal by suspending the distortion compensating function to output the modulated transmission wave X (I, Q) as it is. Also, when the power amp is in ON state, the output signal of the power amp subject to the distortion compensation is monitored at the monitor terminal in the same manner as the above [2] by again validating the distortion compensating function.

It is to be noted that the transmission device may further comprise a series circuit including a distortion compensator, a D/A converter, and a modulator connected in a front stage of the input signal detector, wherein the input signal detector comprises a single coupler, the output signal detector comprises two couplers respectively branching the input signals to the RF switch and the feedback route, and the selector comprises a selector making the distortion compensator connect to the D/A converter or bypassed, in association with the power amp switch being switched ON or OFF.

The above mentioned feedback route may comprise a frequency converter and an A/D converter connected between the couplers of the output signal detector and the distortion compensator.

According to an aspect of the present invention, it is made possible to decrease the number of a monitor terminal of an RF power amp, and to monitor waveforms with less distortion components not only at the output but also the input of the power amp, depending on the power amp being made ON or OFF.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Embodiment [1]

Figure 1:
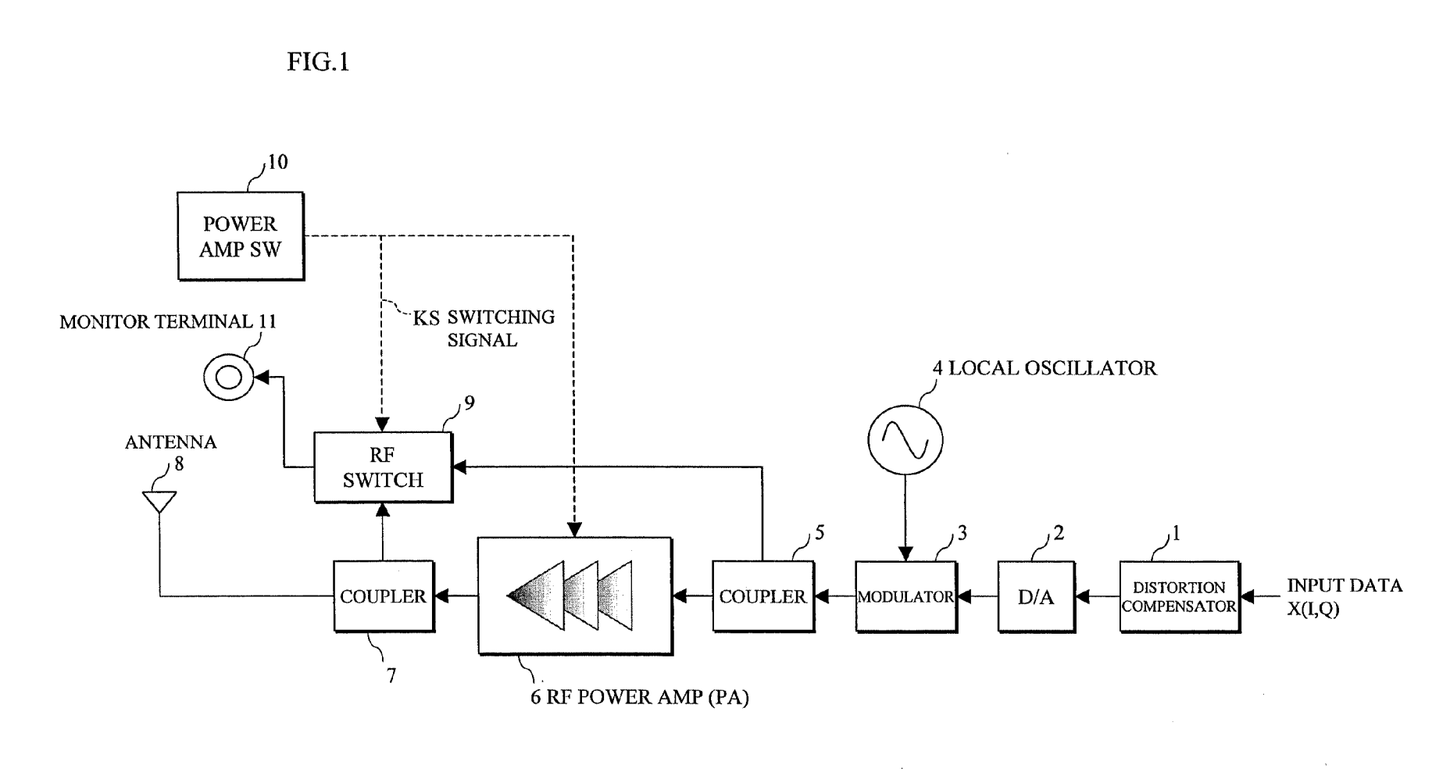
FIG. 1 is a block diagram showing an embodiment [1] of a transmission device.
Figure 2A:
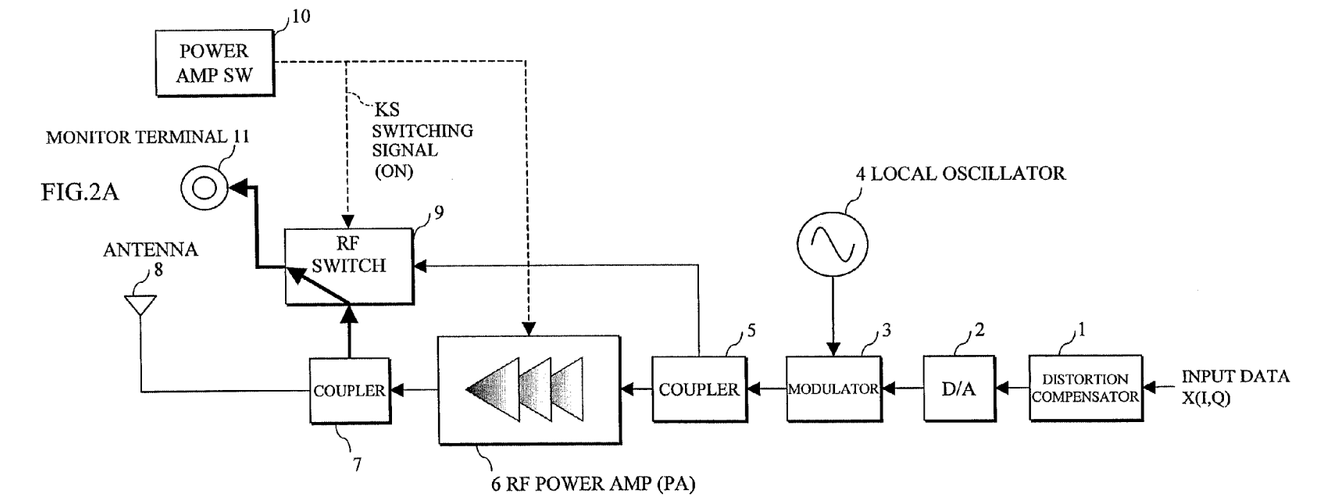
FIG. 2 is a block diagram for illustrating an operation at an RF switch being made ON, in an embodiment [1] of a transmission device.
Figure 2B:
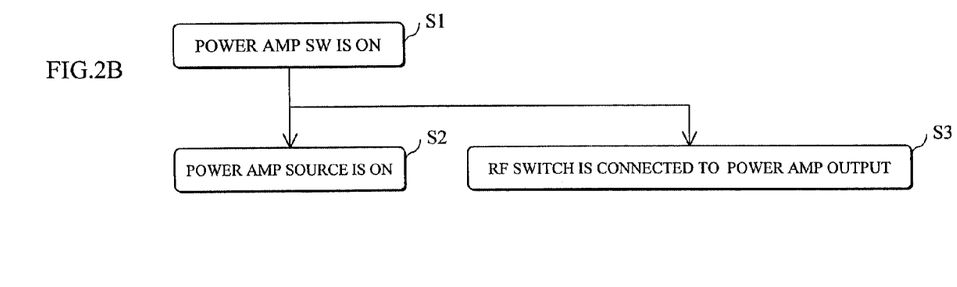
Figure 3A:
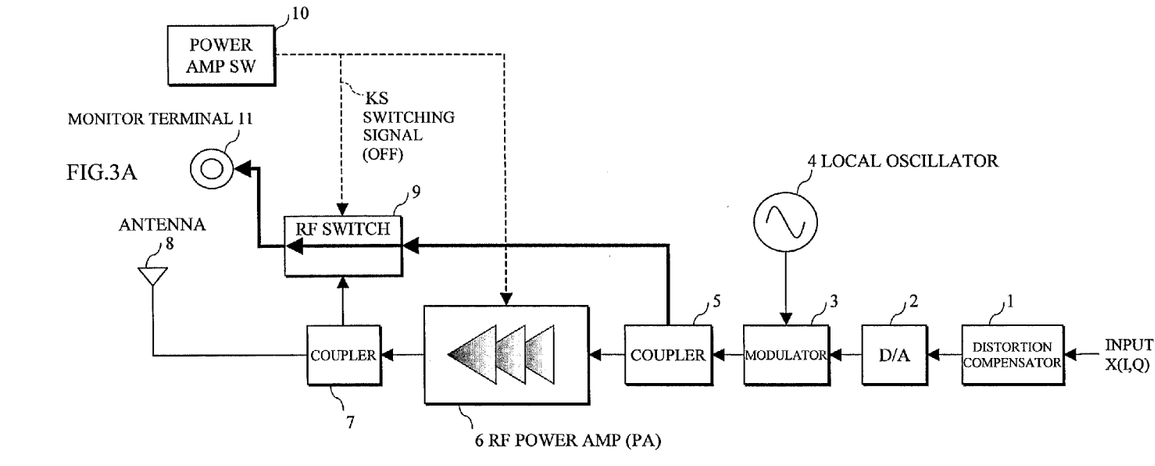
FIG. 3 is a block diagram for illustrating an operation at an RF switch being made OFF, in an embodiment [1] of a transmission device.
Figure 3B:
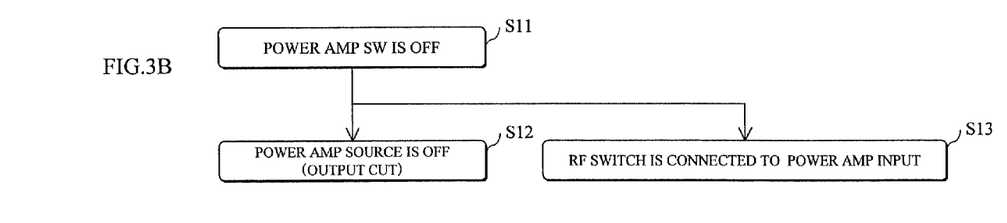

FIGS. 1-3

FIG. 1 shows an embodiment [1] of a transmission device, in which an RF switch 9 is added to the prior art transmission device shown in FIG. 10. Namely, the input signal of the coupler 5 and the input signal of the coupler 7 are respectively branched and provided to the RF switch 9; the switching signal KS from the power amp switch 10 is provided to the RF power amp 6 as well as the RF switch 9; the output signal of the RF switch 9 is provided to a single monitor terminal 11. In this embodiment [1], a feedback route to the distortion compensator 1 is not connected.

FIGS. 2 and 3 illustrate specific operations, in the arrangement of FIG. 1, where a monitoring signal for the RF power amp 6 is selected by the power amp switch 10.

Referring to an operation example at the time when the switching signal KS from the power amp switch 10 is made ON as shown in FIG. 2A, input data X (I, Q) from a base band portion (not shown) are multiplied with a distortion compensating coefficient by the distortion compensator 1, converted into an analog signal by the D/A converter 2, modulated by the modulator 3, passed through the coupler 5, and is provided to the RF power amp 6 for monitoring the input wave thereof. The output signal of the RF power amp 6 passes through the coupler 7 and is transmitted from the antenna 8.

At this time, the output signal (switching signal) KS of the power amp switch 10 indicates ON state (step S1 in FIG. 2B), making the source of the RF power amp 6ON (step S2) and switching the RF switch 9 over to the connection of a thick line shown.

As a result, the RF switch 9 selects the signal branched from the coupler 7 or the output signal of the power amp 6 within the signals branched from the couplers 5 and 7 (step S3), to be transmitted from the antenna 8.

FIG. 3A illustrates an operation at the time when the switching signal KS from the power amp switch 10 is made OFF. In the presence of the OFF signal from the power amp switch 10 (step S11 in FIG. 3A), the source of the RF power amp 6 is made OFF (step S12) while at the same time the output of the RF switch 9 is switched over to the input side of the RF power amp 6 (step S13). At this time, no transmission signal is provided to the antenna 8, so that even though the antenna 8 is opened (even in the state of total reflection) the RF power amp 6 will not fail or excessive heat generation will not occur.

Embodiment [2]

Figure 4:
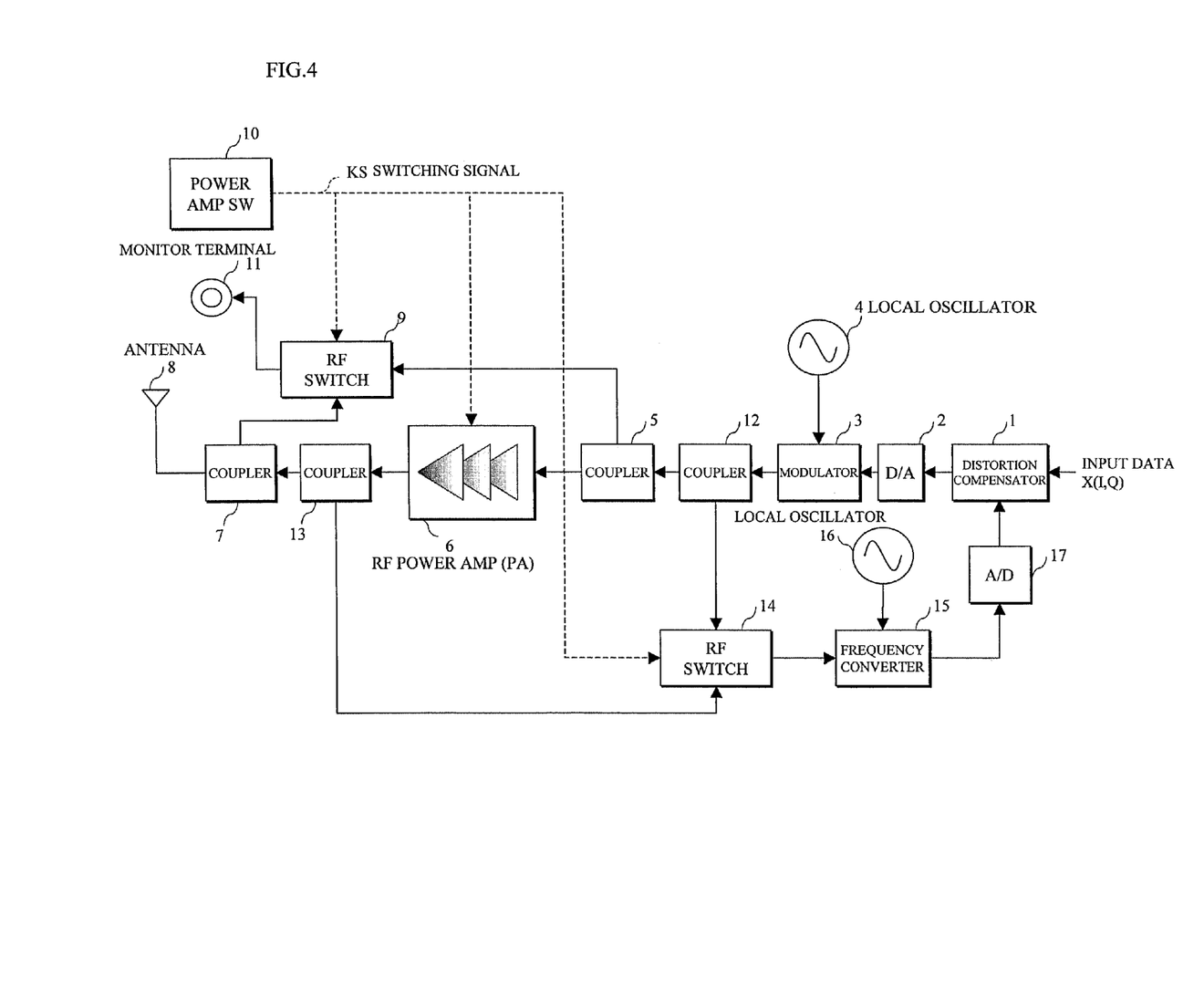
FIG. 4 is a block diagram showing an embodiment [2] of a transmission device.

FIGS. 4-6

FIG. 4 shows an embodiment [2] of a transmission device, which is different from the above embodiment [1] in that there is provided a feedback route to the distortion compensator 1 to reduce distortion components of the output of the power amp 6. Namely, as with the prior art shown in FIG. 10, a signal branched from the coupler 13 is feedback to the distortion compensator 1 via the frequency converter 15 and the A/D converter 17, and besides there is provided another RF switch 14, between the coupler 13 and the frequency converter 15 under control of the switching signal KS concurrently with the power amp 6 and the RF switch 9. To this RF switch 14 a signal branched from a coupler 12 connected between the modulator 3 and the coupler 5 is provided in addition to the signal branched from the coupler 13, and the output of the RF switch 14 is provided to the frequency converter 15.

FIGS. 5 and 6 illustrate specific operations, where the monitoring output of the RF power amp 6 is variously switched over in association with the power amp switch 10.

Figures 5A, 5B:
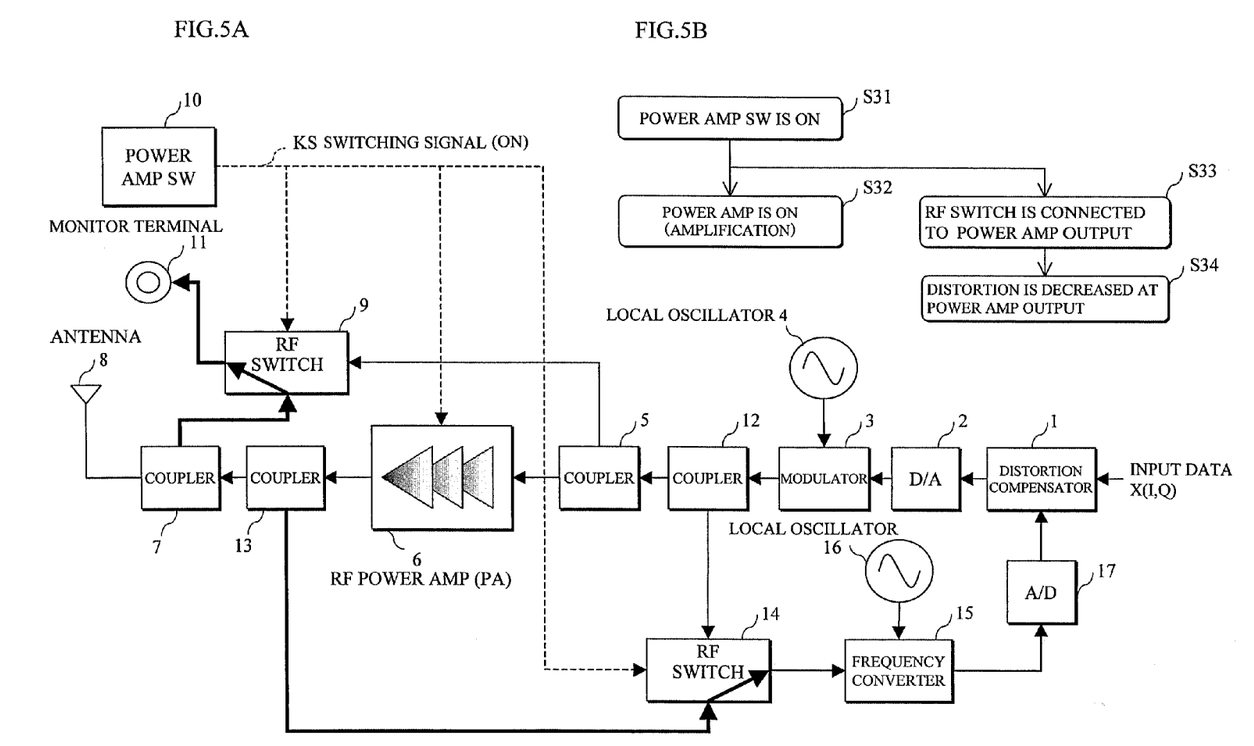
FIG. 5 is a block diagram for illustrating an operation at an RF switch being made ON, in an embodiment [2] of a transmission device.

Referring to an operation example at the time when the switching signal KS from the power amp switch 10 is made ON as shown in FIG. 5A, the input data X (I, Q) is multiplied with a distortion compensating coefficient by the distortion compensator 1, converted into an analog signal by the D/A converter 2, and then modulated by the modulator 3, forming an input signal of the RF power amp 6. This input signal is obtained after having passed through the coupler 12 for feedback and the coupler 5 for monitor, both of which form an input signal detector. An output wave amplified by the RF power amp 6 passes through the coupler 13 for feedback and the coupler 7 for monitor, both of which form an output signal detector, and is transmitted from the antenna 8.

When the switching signal KS from the power amp switch 10 is made ON (step S31 in FIG. 5B), the source of the RF power amp 6 is powered on (step S32), at which time the RF switch 14 which forms a feedback route switching portion is switched over to the amp output side (step S33) to perform distortion compensating operations. Namely, since the feedback route is connected from the output side of the RF power amp 6, an output waveform with less distortion can be obtained from the antenna 8 (step S34).

Figures 6A, 6B:
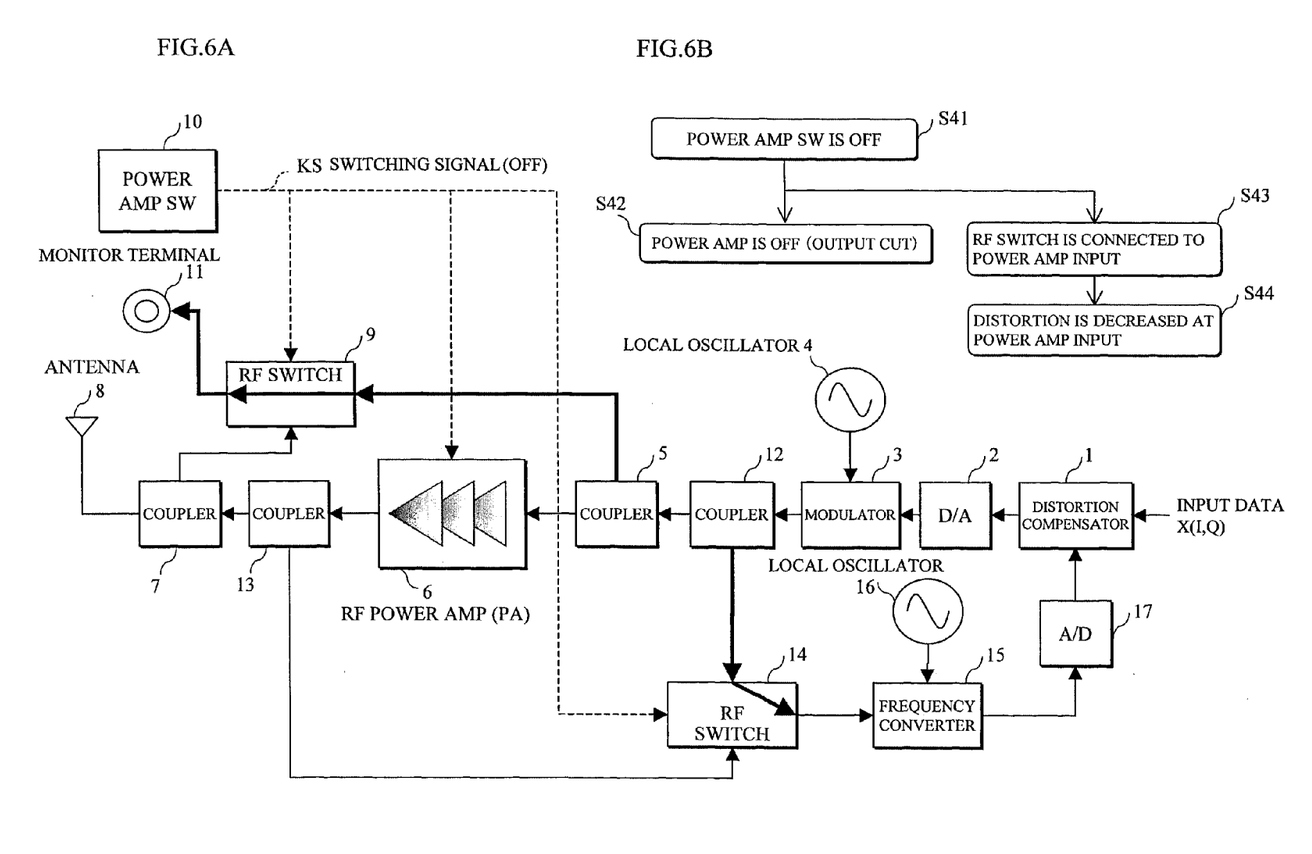
FIG. 6 is a block diagram for illustrating an operation at an RF switch being made OFF, in an embodiment [2] of a transmission device.

FIG. 6A shows a state where the switching signal KS from the power amp switch 10 is made OFF (step S41 in FIG. 6B). When the switching signal KS is made OFF, the source of the RF power amp 6 is made OFF (step S42), at which time the RF switch 14 as a feedback route switching portion selects the branched signal of the coupler 12 on the input side of the RF power amp 6 (step S43) to perform distortion compensating operations. Namely, since the feedback route is connected on the input side of the RF power amp 6, waveforms in which distortion components which can exist on the input side of the power amp 6 are compensated by the distortion compensator 1 can be obtained from the monitor terminal 11.

Embodiment [3]

Figures 7A, 7B:
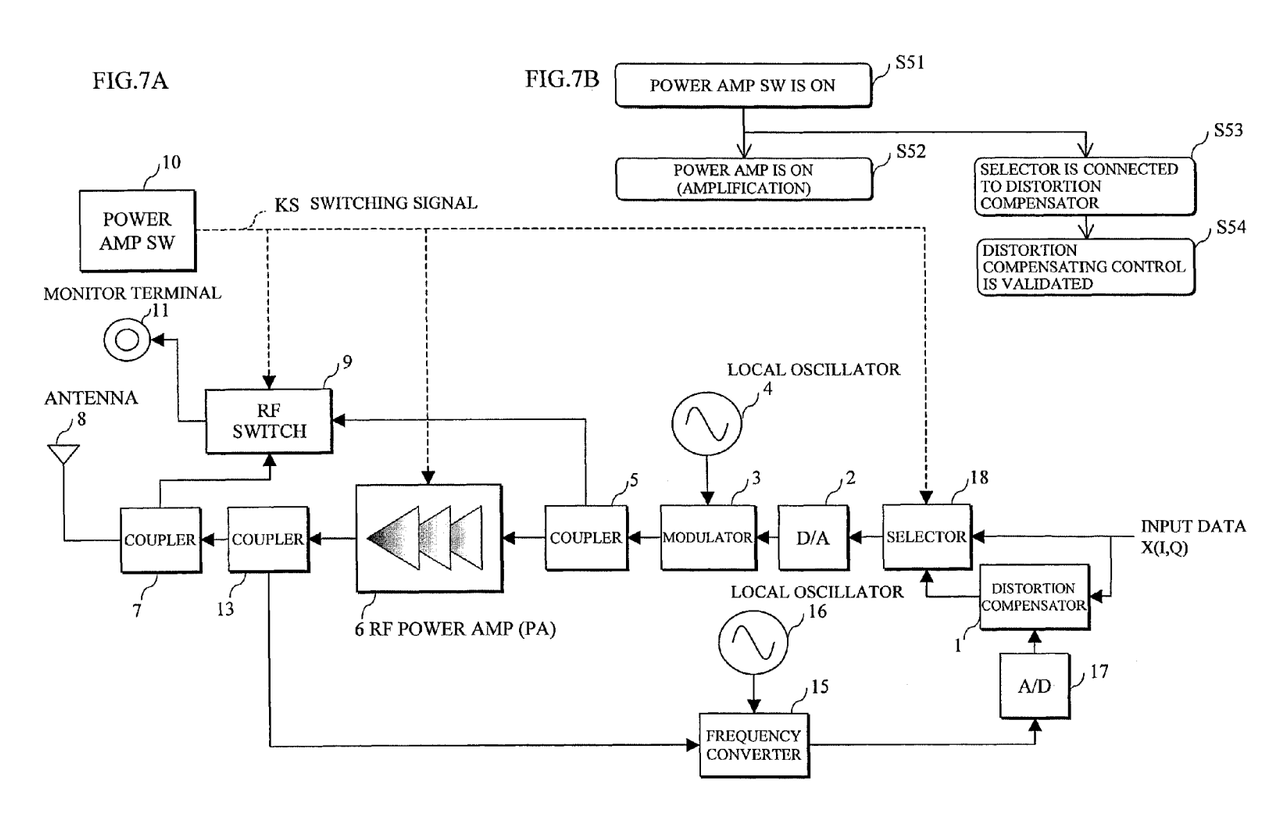
FIG. 7 is a block diagram showing an embodiment [3] of a transmission device.

FIG. 7-9

FIG. 7 shows an embodiment [3] of a transmission device. This embodiment [3] is different from the above embodiment [1] in that for outputting a modulated wave as it is with the distortion compensating function being suspended, the same feedback route as the prior art shown in FIG. 10 is provided, and a selector 18 is provided for validating/invalidating the distortion compensator 1 controlled by the feedback route in association with the switching signal KS from the power amp switch 10 being made ON or OFF. Therefore, this embodiment [3] only has to use a single coupler as an input signal detector.

FIGS. 8 and 9 illustrate specific operations where the monitoring output of the RF power amp 6 is variously switched over in association with the power amp switch 10.

Figures 8A, 8B:
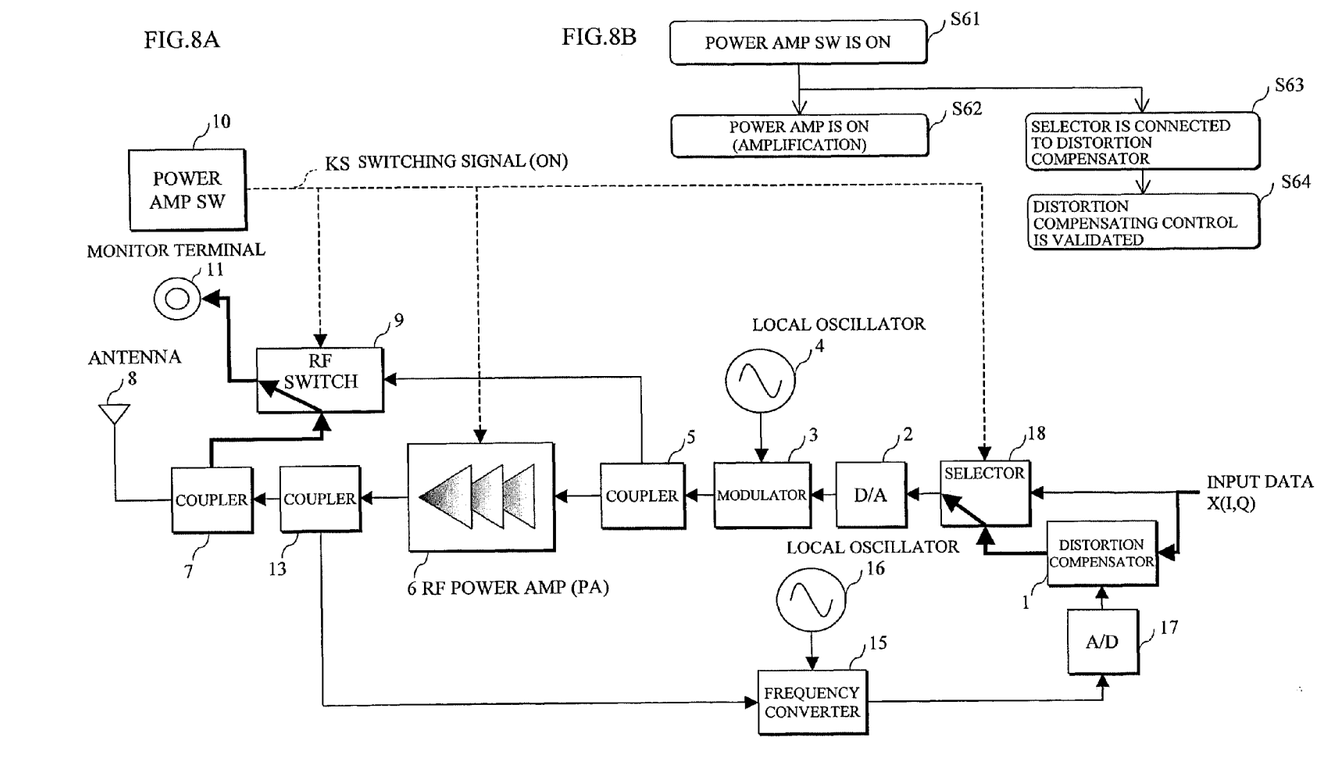
FIG. 8 is a block diagram for illustrating an operation at an RF switch being made ON, in an embodiment [3] of a transmission device.

In an operation example where the switching signal KS from the power amp switch 10 is made ON as shown in FIG. 8A (step S61 in FIG. 8B), the RF power amp 6 is made ON (step S62), and the selector 18 selects the distortion compensator 1 as shown by a thick line (step S63) to perform the distortion compensation with the input data X (I, Q) multiplied with a distortion compensating coefficient (step S64). At this time, the feedback route is connected from the output side of the RF power amp 6, so that an output waveform with less distortion can be obtained from the antenna 8.

It is to be noted that the RF switch 9 at this time transmits the branched signal from the coupler 7, that is an output signal of the RF power amp 6 to the monitor terminal 11 as with the above FIGS. 2 and 5.

Figures 9A, 9B:
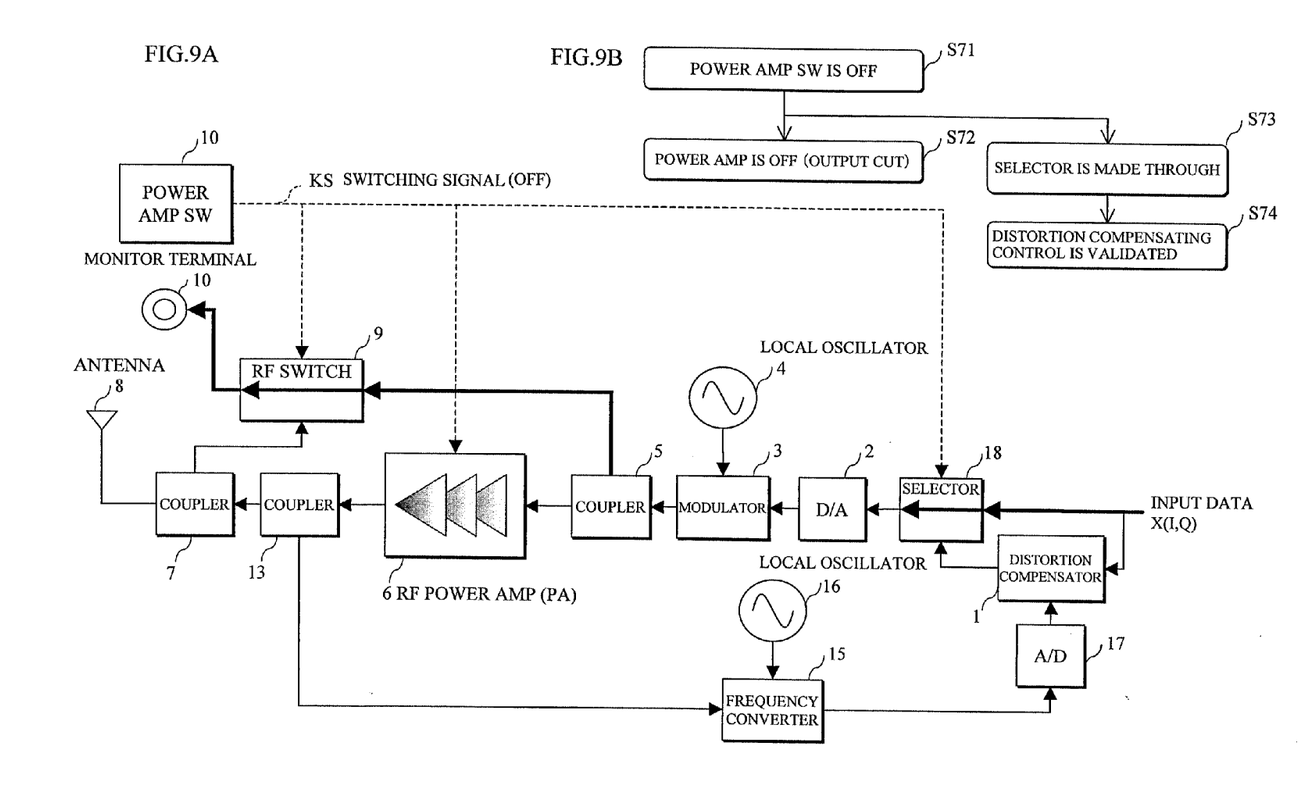
FIG. 9 is a block diagram for illustrating an operation at an RF switch being made OFF, in an embodiment [3] of a transmission device.

FIG. 9A shows a state where the switching signal KS from the power amp switch 10 is made OFF. When the power amp switch 10 is powered down (step S71 in FIG. 9B), the source of the RF power amp 6 is made OFF (step S72) and concurrently the RF switch 9 selects the branched signal of the coupler 5, that is an input signal of the RF power amp 6, to be provided to the monitor terminal 11. At this time, a through input at the selector 18 is made active (step S73), so that the distortion compensator 1 is bypassed to invalidate the distortion compensating operation (step S74).

At this time, a route without the multiplication of the distortion compensating coefficient by the distortion compensator 1 is selected or no distortion compensation is applied, where distortion components arising on the input side of the RF power amp 6 are inherently little, so that distortions become less than the waveform in the application of the distortion compensating coefficient for the power amp 6, enabling waveforms with less distortions (wave only applied with modulation) to be monitored at the monitor terminal 11.

It is to be noted that the present invention is not limited by the above-mentioned embodiments, and it is obvious that various modifications may be made by one skilled in the art based on the recitation of the claims.

What is claimed is:

1. A transmission device comprising:
   an RF power amplifier;
   an input signal detector detecting an input signal of the power amplifier;
   an output signal detector detecting an output signal of the power amplifier;
   a first power amplifier switch switching ON or OFF the power amplifier;
   a monitor terminal; and
   an RF switch selecting an input signal or output signal of the power amplifier to be transmitted to the monitor terminal, in association with the first power amplifier switch being switched ON or OFF.

2. The transmission device as claimed in claim 1, further comprising a distortion compensator provided in a front stage of the input signal detector, a feedback route connected to the distortion compensator, and a second RF switch selecting an input signal or output signal of the power amplifier to be transmitted to the distortion compensator through the feedback route, in association with the power amplifier switch being switched ON or OFF.

3. The transmission device as claimed in claim 2, wherein the feedback route includes a frequency converter and an A/D converter connected between the second RF switch and the distortion compensator.

4. The transmission device as claimed in claim 1, further comprising a distortion compensator provided in a front stage of the power amplifier, a feedback route feeding back the output signal of the power amplifier to the distortion compensator, and a selector validating or invalidating the distortion compensator, in association with the power amplifier switch being switched ON or OFF.

5. The transmission device as claimed in claim 4, further comprising a series circuit including a distortion compensator, a D/A converter, and a modulator connected in a front stage of the input signal detector, wherein the input signal detector comprises a single coupler, the output signal detector comprises two couplers branching the input signals to the RF switch and the feedback route, and the selector comprises a selector making the distortion compensator connect to the D/A converter or bypassed, in association with the power amplifier switch being switched ON or OFF.

6. The transmission device as claimed in claim 5, wherein the feedback route comprises a frequency converter and an A/D converter connected between the couplers of the output signal detector and the distortion compensator.

7. The transmission device as claimed in claim 1, further comprising a series circuit including a distortion compensator, a D/A converter, and a modulator connected in a front stage of the input signal detector.

8. The transmission device as claimed in claim 1, further comprising a series circuit including a distortion compensator, a D/A converter, and a modulator connected in a front stage of the input signal detector, wherein each detector comprises two couplers branching the input signals to each RF switch.

* * * * *